United States Patent [19]
Hwang

[11] Patent Number: 6,154,404
[45] Date of Patent: Nov. 28, 2000

[54] INTEGRATED CIRCUIT MEMORY DEVICES HAVING SENSE AMPLIFIER DRIVER CIRCUITS THEREIN THAT IMPROVE WRITING EFFICIENCY

[75] Inventor: Hong-sun Hwang, Kyungki-do, Rep. of Korea

[73] Assignee: Samsung Electronics Co., Ltd., Rep. of Korea

[21] Appl. No.: 09/358,138

[22] Filed: Jul. 20, 1999

[30] Foreign Application Priority Data

Jul. 23, 1998 [KR] Rep. of Korea .................. 98-29736

[51] Int. Cl.[7] ................................... G11C 7/00
[52] U.S. Cl. .................. 365/205; 365/207; 365/149
[58] Field of Search ................... 365/205, 233, 365/207, 149, 230.03

[56] References Cited

U.S. PATENT DOCUMENTS

| | | |
|---|---|---|
| 4,802,129 | 1/1989 | Hoekstra et al. ............... 365/233 X |
| 5,548,560 | 8/1996 | Stephens, Jr. et al. ........... 365/233 X |
| 5,555,210 | 9/1996 | Kato ............................... 365/205 X |
| 5,787,042 | 7/1998 | Morgan ............................ 365/205 |

*Primary Examiner*—Huan Hoang
*Attorney, Agent, or Firm*—Myers Bigel Sibley & Sajovec

[57] ABSTRACT

Integrated circuit memory devices include a sense amplifier which is electrically coupled to a first pair of bit lines (BL and /BL) and is responsive to at least one amplifier enable signal (e.g., AE1, AE2). A preferred driver circuit is also provided. The driver circuit is responsive to a write enable pulse ($\phi$WR) and drives the at least one amplifier enable signal to an inactive state (e.g., high impedance state) in response to a leading edge of the write enable pulse and to an active state (Vss or Vcc) in response to a trailing edge of the write enable pulse. The memory device also includes a write enable buffer that generates a write enable pulse in response to a write enable signal. By disposing the sense amplifier in an inactive state early in response to a leading edge of the write enable pulse, improved writing efficiency can be achieved.

9 Claims, 3 Drawing Sheets

INTEGRATED CIRCUIT MEMORY DEVICES HAVING SENSE AMPLIFIER DRIVER CIRCUITS THEREIN THAT IMPROVE WRITING EFFICIENCY

FIELD OF THE INVENTION

The present invention relates to integrated circuits, and more particularly to synchronous integrated circuit memory devices and methods of operating synchronous integrated circuit memory devices.

BACKGROUND OF THE INVENTION

Recent trends to increase the operating speed of integrated circuit memory devices (e.g., DRAM devices) have focused on techniques to increase the rates at which data can be read from and written into memory cells within the devices. In such devices, sense amplifiers are typically used during reading operations to sense relatively small differential signals and then amplify them to rail-to-rail signal levels (e.g., Vcc and Vss). As will be understood by those skilled in the art, the amplified signals may then be transferred to pairs of input/output lines and then to an output buffer using column decoding techniques. Because sense amplifiers play a significant role in both reading data from and writing data to a memory device, techniques to improve the speed at which sense amplifiers can perform accurate sense and amplify operations have been pursued.

Referring now to FIG. 1, a conventional technique for reading data from and writing data to a memory cell (MC) will be described. In particular, during a reading operation, a word line WL may be driven to a logic 1 level to turn on an NMOS access transistor within the memory cell MC. Charge stored within a storage capacitor may then be transferred through the NMOS access transistor to a bit line BL. If the pair of complementary bit lines BL and /BL have been equalized at a common potential (e.g.,½Vcc), then the transfer of charge to the bit line BL will cause the potential of the bit line BL to increase relative to the potential of the complementary bit line /BL. Once this transfer has occurred, a sense amplifier SA can be used to "sense" and then "amplify" the differential potential established across the complementary bit lines. As illustrated, a conventional sense amplifier SA may comprise a pair of serially-connected NMOS transistors and a pair of serially-connected PMOS transistors. The gate electrodes of these transistors are also cross-coupled in the manner illustrated. An NMOS pull-down transistor and a PMOS pull-up transistor are also typically provided. The NMOS pull-down transistor is responsive to signal φSEN and the PMOS pull-up transistor is responsive to signal φSEP. Thus, when signal φSEN is driven to a logic 1 level and signal φSEP is driven to a logic 0 level, node A of the sense amplifier will be driven to Vss and node B of the sense amplifier will be driven to Vcc.

These operations activate the sense amplifier and enable the amplify operation to be performed on the differential signal established across the complementary bit lines BL and /BL. Accordingly, the bit line BL will be driven to Vcc and the complementary bit line /BL will be driven to Vss. The column select signal line CSL can then be driven to a logic 1 level to enable the transfer of the "read" data to the pair of complementary input/output lines IO and /IO. This transfer occurs through the NMOS pass transistors 11 and 12 which are responsive to the column select signal CSL. Alternatively, during a writing operation, a rail-to-rail differential signal established across the complementary input/output lines IO and /IO can be transferred to the complementary bit lines BL and /BL and then sensed and amplified by the sense amplifier SA before being stored within the memory cell MC upon activation of the word line.

Unfortunately, if a data read operation is performed and then followed by a data write operation to the same pair of bit lines and the read data is the opposite of the write data, a significant amount of delay may be incurred in switching (i.e., reversing) the differential signal established across the complementary bit lines BL and /BL and latched by the sense amplifier SA. Thus, notwithstanding the above-described sense amplifier, there continues to be a need for improved memory devices that can switch the value of a differential signal established across a pair of complementary bit lines in a more efficient manner to improve read and write cycle times.

SUMMARY OF THE INVENTION

It is therefore an object of the present invention to provide improved integrated circuit memory devices and methods of operating same.

It is another object of the present invention to provide integrated circuit memory devices that can be written to efficiently.

These and other objects, advantages and features of the present invention may be provided by integrated circuit memory devices that include a sense amplifier which is electrically coupled to a first pair of bit lines (BL and /BL) and is responsive to at least one amplifier enable signal (e.g., AE1, AE2). A preferred driver circuit is also provided. The driver circuit is responsive to a write enable pulse (φWR) and drives the at least one amplifier enable signal to an inactive state (e.g., high impedance state) in response to a leading edge of the write enable pulse and to an active state (Vss or Vcc) in response to a trailing edge of the write enable pulse. The memory device also includes a write enable buffer that generates a write enable pulse in response to a write enable signal. By disposing the sense amplifier in an inactive state early in response to a leading edge of the write enable pulse, improved writing efficiency can be achieved.

According to a preferred embodiment of the present invention, the sense amplifier is responsive to first and second amplifier enable signals (AE1 and AE2) and the driver circuit drives both the first and second amplifier enable signals to high impedance states in response to the leading edge of the write enable pulse (φWR) and also drives the first and second amplifier enable signals to first and second opposite logic states (Vss and Vcc), respectively, in response to the trailing edge of the write enable pulse. The driver circuit preferably comprises an AND logic circuit that is responsive to an inverted version of the write enable pulse, a block selection signal (φBLSi) and a sense enable signal (φSE). An NMOS pull-down transistor and a PMOS pull-up transistor are also provided. The NMOS pull-down transistor generates the first amplifier enable signal (AE1) at a drain thereof and is responsive to an output of the AND logic circuit. The PMOS pull-up transistor generates the second amplifier enable signal (AE2) at a drain thereof and is also responsive to the output of the AND logic circuit. The driver circuit may also include an inverter having an input electrically coupled to a gate electrode of the NMOS pull-down transistor and the output of the AND logic circuit, and an output electrically coupled to a gate electrode of the PMOS pull-up transistor.

According to another embodiment of the present invention, preferred methods of operating integrated circuit memory devices include the steps of sensing a first differential signal established across a pair of bit lines during a read time interval and then amplifying the first differential signal by driving a first bit line in the pair of complementary bit lines to a first logic potential and driving a second bit line in the pair of complementary bit lines to a second logic potential opposite the first logic potential, using a sense amplifier. Preferred steps are then performed to disable the sense amplifier in response to a leading edge of a write enable pulse during a first portion of a write time interval so that write data can be provided early to the pair of bit lines. The sense amplifier is then enabled in response to a trailing edge of the write enable pulse during a second portion of the write time interval.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
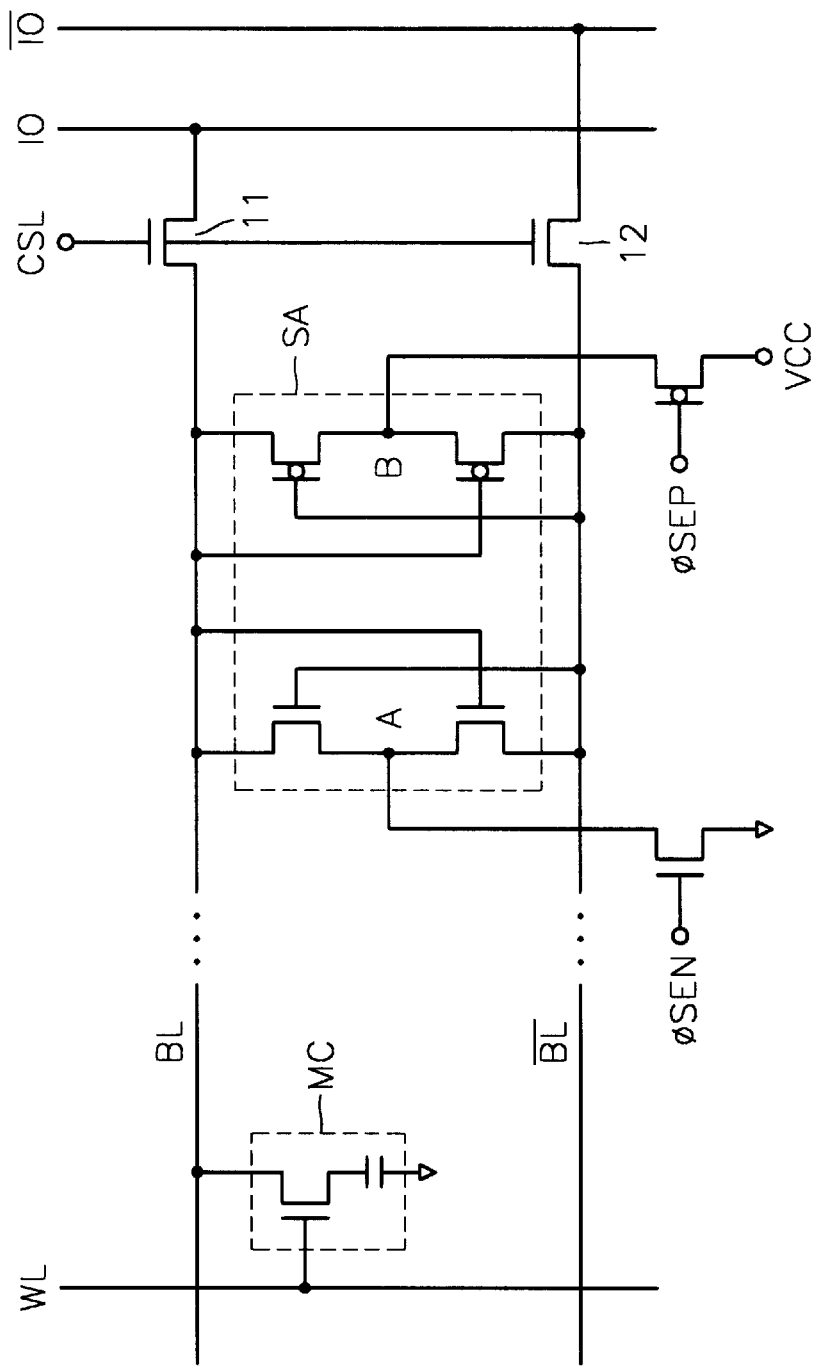
FIG. 1 is an electrical schematic of portion of a conventional integrated circuit memory device containing a sense amplifier therein.
Figure 2:
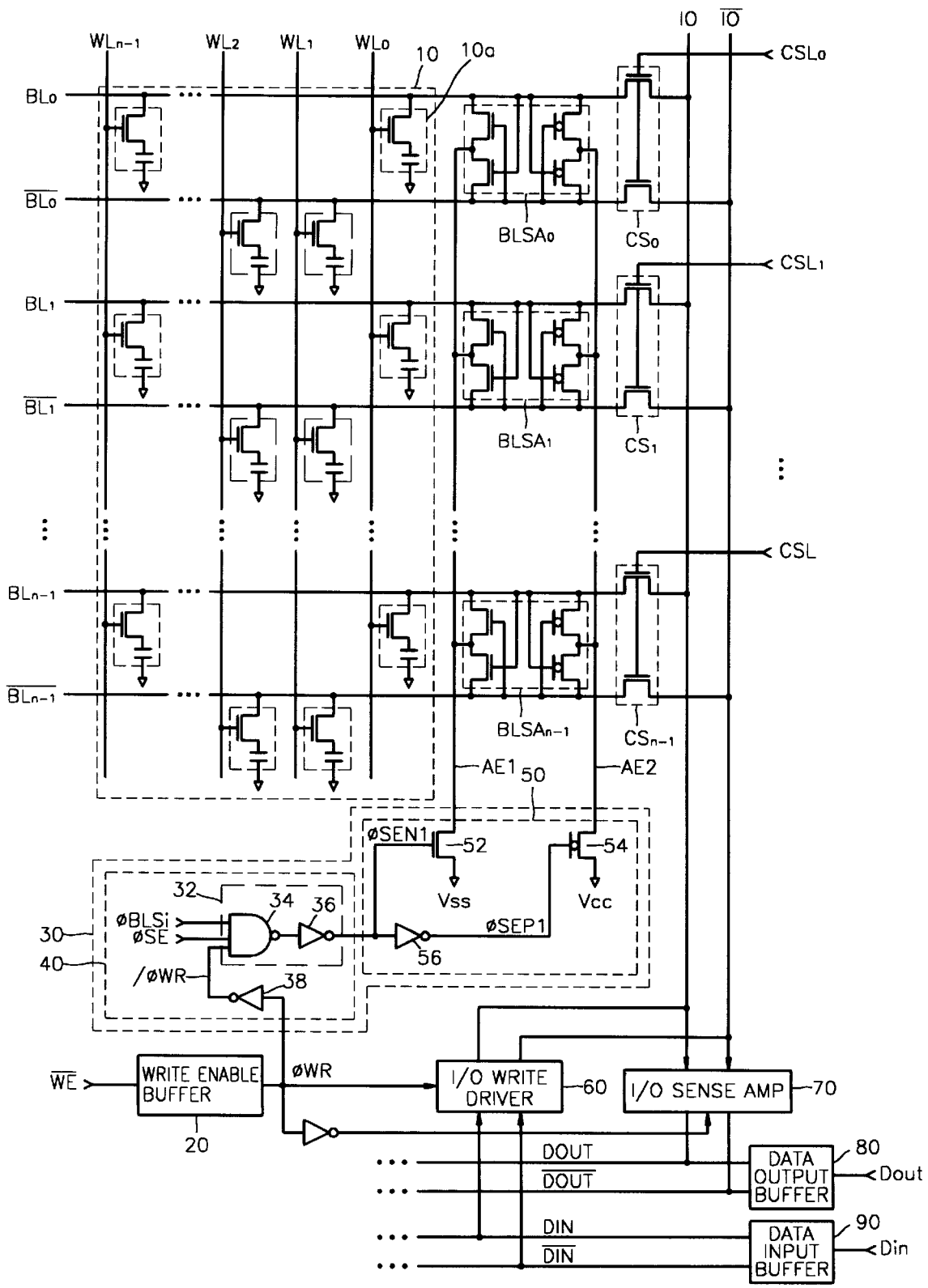
FIG. 2 is an electrical schematic of an integrated circuit memory device according to a first embodiment of the present invention.

Referring now to FIG. 2, a preferred embodiment of an integrated circuit memory device according to the present invention will be described. As illustrated, the memory device comprises a plurality of blocks 10 of memory cells. These memory cells may comprise DRAM cells and each cell may be provided with a respective access transistor (e.g., NMOS transistor) and storage capacitor. Columns of memory cells may also be provided in each block 10 and the gate electrodes of each access transistor in a column of memory cells may be electrically coupled to a respective word line (e.g., $WL_0$–$WL_{n-1}$). A plurality of sense amplifiers $BLSA_0$–$BLSA_{n-1}$ of conventional design may also be provided. As illustrated, the pair of data inputs to each sense amplifier are electrically coupled to a respective pair of complementary bit lines (BL0, /BL0)–($BL_{n-1}$, /$BL_{n-1}$). Each pair of amplify control inputs for each sense amplifier is also commonly connected to a pair of amplifier enable signal lines AE1 and AE2. These amplifier enable signal lines AE1 and AE2 receive first and second amplifier enable signals that are generated by a sense amplifier driver circuit 30. The construction and operation of the illustrated sense amplifiers is more fully described in U.S. Pat. No. 5,701,268 to Lee et al. entitled "Sense Amplifier for Integrated Circuit memory Devices Having Boosted Sense and Current Drive Capability and Methods of Operating Same", assigned to the present assignee, the disclosure of which is hereby incorporated herein by reference.

As illustrated by dotted lines and described more fully hereinbelow, the sense amplify driver circuit 30 comprises a sense amplifier driver 50 and a sense amplify enable circuit 40. A plurality of column switches $CS_0$–$CS_{n-1}$ are also provided. Each column switch is responsive to a respective column select signal $CSL_0$–$CSL_{n-1}$. Because the illustrated column switches comprise NMOS transistors, the application of a logic 1 signal to a respective column select signal line will cause a respective pair of complementary bit lines to become electrically connected to a pair of complementary input/output lines IO and /IO. Accordingly, the column select signal lines $CSL_0$–$CSL_{n-1}$ can be used to control the transfer of read data from a respective pair of complementary bit lines to the complementary input/output lines IO and /IO and control the transfer of write data from the input/output lines IO and /IO to a respective pair of bit lines.

As will be understood by those skilled in the art, a conventional data input/output circuit may be provided that includes a input/output write driver 60 and input/output sense amplifier 70, a data output buffer 80 and a data input buffer 90, connected as illustrated. During a reading operation, the input/output sense amplifier 70 may be configured to amplify a differential signal established across the input/output lines IO and /IO. The illustrated input/output lines may have considerably greater capacitance than a pair of complementary bit lines. Accordingly, the transfer of a differential signal (i.e., read data) from a pair of complementary bit lines BL and /BL to the input/output lines IO and /IO may result in an attenuation of the differential signal. Nonetheless, such attenuation can be reversed by using a input/output sense amplifier 70 to sense and amplify the differential signal and drive a pair of complementary data output lines DOUT and /DOUT and the data output buffer 80. The write driver 60 also performs the function of driving the pair of complementary input/output lines IO and /IO with write data during a writing operation. This write data is provided on the pair of complementary data input lines DIN and /DIN by the data input buffer 90.

The write driver 60 is responsive to a write enable pulse φWR having a predetermined pulse width. The write enable pulse φWR is provided by a write enable buffer 20 that is responsive to a write enable signal /WE. In particular, the write enable buffer 20 may be configured to generate a logic 1 write enable pulse φWR in response to a 1→0 transition by the write enable signal /WE (i.e., when the write enable signal /WE becomes enabled). An inverted version of the write enable pulse φWR may also be provided as an input to the input/output sense amplifier 70.

The sense amplifier enable circuit 40 may also be responsive to the write enable pulse φWR. In particular, the sense amplifier enable circuit 40 may include an inverter 38 for inverting a logic 1 write enable pulse φWR into a logic 0 pulse at the input of an AND circuit 32. As illustrated, the AND circuit may comprise a three-terminal NAND gate and an inverter 36 connected in series. A block selection signal (φBLSi and a sense enable signal φSE are also provided as inputs to the AND circuit 32. As will be understood by those skilled in the art, the block selection signal φBLSi and the sense enable signal φSE are utilized to select one memory block from a plurality of memory blocks and for instructing the memory device to perform a sensing operation, respectively. The sense amplifier enable circuit 40 generates a driving enable signal φSEN1 at a logic 1 level when all of the signals φBLSi, φSE and /φWR are set to logic 1 levels. The inverter 56 will also invert the driving enable signal φSEN1 and generate an inverted driving enable signal φSEP1. Accordingly, when all of the signals φBLSi, φSE and /φWR are set to logic 1 levels, the NMOS pull-down transistor 52 will turn on and pull-down the first amplifier enable signal line AE1, PMOS pull-up transistor 54 will turn ond an pull-up the second amplifier enable signal line AE2, and each of the sense amplifiers $BLSA_0-BLSA_{n-1}$ will become active to thereby perform a respective amplify operation.

Alternatively, a leading 0→1 transition by the write enable pulse φWR will cause signal /φWR and the driving enable signal φSEN1 to switch to logic 0 levels and the inverted driving enable signal φSEP1 to switch to a logic 1 level. Thus, a leading edge of the write enable pulse φWR will operate to turn off both the NMOS pull-down transistor 52 and the PMOS pull-up transistor 54 and dispose the first and second amplifier enable signal lines AE1 and AE2 in high impedance states. Driving the first and second amplifier enable signal lines AE1 and AE2 to high impedance states operates to disable the bit line sense amplifiers $BLSA_0-BLSA_{n-1}$. Likewise, when both signals φBLSi and φSE are set to logic 1 levels, a trailing 1→0 transition by the write enable pulse φWR will operate to re-enable the bit line sense amplifiers $BLSA_0-BLSA_{n-1}$.

Figure 3:
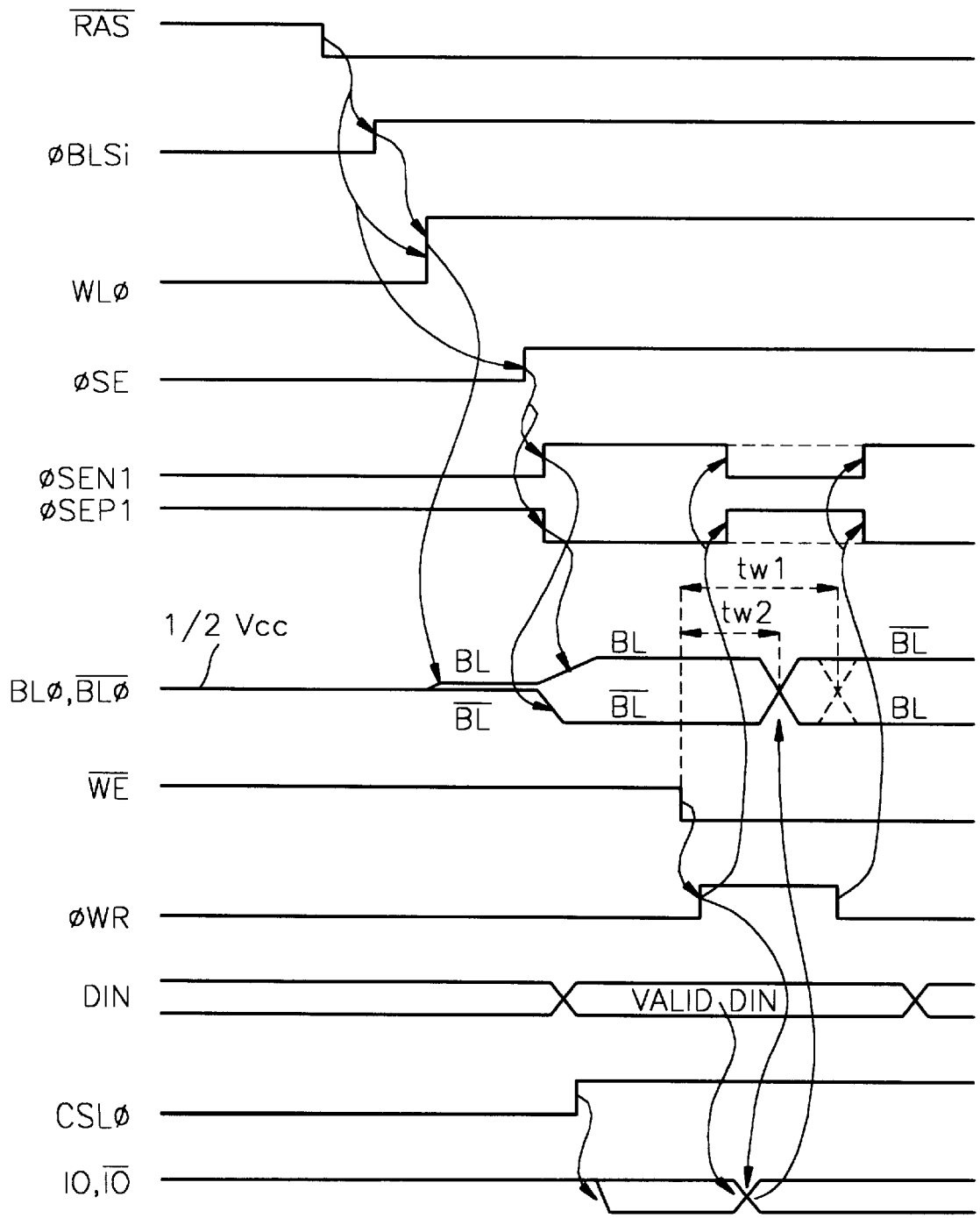
FIG. 3 is a timing diagram that illustrates operation of the memory device of FIG. 2.

Referring now to FIG. 3, preferred operations for reading data from and writing data into the illustrated memory block 10 of FIG. 2 will be described. As illustrated, a first word line WL0 is driven to a logic 1 level in-sync with a falling edge of a row address strobe signal /RAS. In addition, the block selection signal φBLSi and the sense enable signal φSE are also driven to logic 1 levels in-sync with a falling edge of the row address strobe signal /RAS. If the memory cell 10a in the memory block 10 is storing a logic 1 level, then the activation of the first word line WL0 will result in a transfer of logic 1 data from the storage capacitor with the memory cell 10a to the first bit line BL0. Accordingly, a differential signal will be established across the first pair of complementary bit lines BL0 and /BL0, as illustrated.

Moreover, because the write enable pulse φWR has not been generated in response to a 1→0 transition of the write enable signal /WE (since a write operation has not been initiated), and because the block selection signal φBLSi and the sense enable signal φSE are both set to logic 1 levels, the driving enable signal φSEN1 will be set to a logic 1 level and the inverted driving enable signal φSEP1 will be set to a logic 0 level. These transitions of the driving enable signal φSEN1 and the inverted driving enable signal φSEP1 will cause the first and second amplifier enable signal lines AE1 and AE2 to be driven to logic 0 and logic 1 levels, respectively, and dispose the sense amplifier $BLSA_0$ in an active state. Accordingly, the relatively small differential signal established across the first pair of complementary bit lines BL0 and /BL0 will be amplified to rail-to-rail levels (Vcc and Vss). The first column select signal line $CSL_0$ can then be driven to a logic 1 level so that the read data from the memory cell 10a can be transferred to the pair of input/output lines IO and /IO and via the input/output sense amplifier 70 to the data output buffer 80. During this reading operation, write data may also be received by the data input buffer 90 and provided to the complementary data input lines DIN and /DIN.

A write operation can then be initiated by driving the write enable signal /WE to a logic 0 level. In response, the logic 1 write enable pulse φWR will be generated and the driving enable signal φSEN1 will be set to a logic 0 level and the inverted driving enable signal φSEP1 will be set to a logic 1 level in-sync with a rising edge of the write enable pulse, as illustrated. Setting the driving enable signal φSEN1 to a logic 0 level and the inverted driving enable signal φSEP1 to a logic 1 level will operate to turn off the NMOS pull-down transistor 52 and the PMOS pull-up transistor and dispose the first and second amplifier enable signal lines AE1 and AE2 in high impedance states. Disposing the first and second amplifier enable signal lines AE1 and AE2 in high impedance states will also act to disable the first bit line sense amplifier $BLSA_0$ for a duration equivalent to the duration of the write enable pulse φWR. The duration of the write enable pulse φWR should be sufficient to enable a complete and reliable transfer of read data to the input/output sense amplifier 70 and with enough margin to enable the sense amplifier 70 to sense and amplify the received data and pass the data to the output buffer 80.

According to a preferred aspect of the present invention, these operations to disable the first bit line sense amplifier $BLSA_0$ can be used advantageously during an operation to write data (provided by the input/output write driver 60) into the memory cell 10a. As illustrated by FIG. 3, this write data may be opposite in value to the data read from the memory cell 10a during the preceding read operation. However, because the write operation can commence early (after a short interval "tw2" relative to the longer interval "tw1" associated with devices of the prior art), the rail-to-rail voltage levels on the first pair of complementary bit lines BL0 and /BL0 can be switched to opposite levels in anticipation of the reactivation of the first bit line sense amplifier $BLSA_0$ following the trailing edge of the write enable pulse φWR. Accordingly, because it is not necessary that the first pair of complementary bit lines BL0 and /BL0 be reequalized at ½Vcc levels prior to writing data back into a memory cell, the overall time required to write data into a memory cell can be reduced and other increases in writing efficiency can be achieved.

The present invention therefore provides an improved method of operating an integrated circuit memory device that comprises the steps of sensing a first differential signal established across a pair of complementary bit lines during a read time interval and then amplifying the first differential signal by driving a first bit line in the pair of complementary bit lines to a first logic potential and driving a second bit line in the pair of complementary bit lines to a second logic potential opposite the first logic potential, using a sense amplifier. Steps are then performed to disable the sense amplifier in response to a leading edge of a write enable pulse during a first portion of a write time interval so that write data can be transferred to the pair of complementary bit lines. A step is then performed to reenable the sense amplifier in response to a trailing edge of the write enable pulse during a second portion of the write time interval.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a sense amplifier electrically coupled to a pair of bit lines and responsive to at least one amplifier enable signal; and
   means, responsive to a write enable pulse, for driving the at least one amplifier enable signal to an inactive state in response to a leading edge of the write enable pulse and to an active state in response to a trailing edge of the write enable pulse, said driving means comprising an AND logic circuit that is responsive to an inverted version of the write enable pulse, a block selection signal and a sense enable signal.

2. The memory device of claim 1, further comprising a write driver that is responsive to the write enable pulse.

3. The memory device of claim 1, wherein said driving means comprises:
   an NMOS pull-down transistor that generates the first amplifier enable signal at a drain thereof and is responsive to an output of the AND logic circuit; and
   a PMOS pull-up transistor that generates the second amplifier enable signal at a drain thereof and is responsive to the output of the AND logic circuit.

4. The memory device of claim 3, wherein said driving means comprises an inverter having an input electrically coupled to a gate electrode of said NMOS pull-down transistor and the output of the AND logic circuit, and an output electrically coupled to a gate electrode of said PMOS pull-up transistor.

5. An integrated circuit memory device, comprising:
   a first memory cell containing an access transistor and a storage capacitor therein;
   a second memory cell containing an access transistor and a storage capacitor therein;
   first and second bit lines electrically connected to the access transistor in said first memory cell and the access transistor in said second memory cell, respectively;
   a sense amplifier electrically coupled to said first and second bit lines and responsive to first and second amplifier enable signals; and
   a driver circuit that drives the first and second amplifier enable signals to high impedance states in response to a leading edge of a write enable pulse and to active states in response to a trailing edge of the write enable pulse, said driver circuit comprising an AND logic circuit that is responsive to an inverted version of the write enable pulse, a block selection signal and a sense enable signal.

6. The memory device of claim 5, wherein said driver circuit comprises:
   an NMOS pull-down transistor that generates the first amplifier enable signal at a drain thereof and is responsive to an output of the AND logic circuit; and
   a PMOS pull-up transistor that generates the second amplifier enable signal at a drain thereof and is responsive to the output of the AND logic circuit.

7. The memory device of claim 6, wherein said driver circuit comprises an inverter having an input electrically coupled to a gate electrode of said NMOS pull-down transistor and the output of the AND logic circuit, and an output electrically coupled to a gate electrode of said PMOS pull-up transistor.

8. The memory device of claim 7, further comprising a write driver that is responsive to the write enable pulse.

9. An integrated circuit memory device, comprising:
   a sense amplifier electrically coupled to a pair of bit lines and responsive to at least one amplifier enable signal; and
   means, responsive to a write enable pulse, a block selection signal and a sense enable signal, for driving the at least one amplifier enable signal to an inactive state in response to a leading edge of the write enable pulse and to an active state in response to a trailing edge of the write enable pulse.

* * * * *